United States Patent [19]

Butler et al.

[11] Patent Number: 4,590,437
[45] Date of Patent: May 20, 1986

[54] HIGH FREQUENCY AMPLIFIER

[75] Inventors: Scott J. Butler, Auburn; Robert J. Regan, Needham; Anthony B. Varallo, Lynn, all of Mass.

[73] Assignee: GTE Laboratories Incorporated, Waltham, Mass.

[21] Appl. No.: 604,779

[22] Filed: Apr. 27, 1984

[51] Int. Cl.[4] .......................... H03F 3/26; H03F 3/68
[52] U.S. Cl. .................................. 330/277; 330/269; 330/295; 330/296; 330/297
[58] Field of Search .................... 330/70, 71, 73, 74, 330/124 R, 262, 273, 275, 276, 277, 295, 297, 296

[56] References Cited

U.S. PATENT DOCUMENTS 4,342,967 8/1982 Regan et al. .................. 330/277

FOREIGN PATENT DOCUMENTS 652137 11/1962 Canada ........................... 330/297
1277356 9/1968 Fed. Rep. of Germany ...... 330/297
1238817 7/1960 France ........................... 330/273

Primary Examiner—James B. Mullins
Attorney, Agent, or Firm—David M. Keay

[57] ABSTRACT

High voltage, high frequency amplifier employing power transistors. The amplifier provides parallel ac signal amplification paths through each transistor and a single dc power path through the transistors in series. In one embodiment two FET's have their source electrodes connected to an input terminal and their drain electrodes connected to an output terminal so as to provide two parallel ac amplifying paths while blocking dc current flow. The drain electrode of the first FET is connected through an RF choke to source of dc operating potential, and its source electrode is connected through an RF choke to the drain electrode of the second FET. The gate electrode of the second FET is connected to ground. A single dc conductive path is thus provided between the source of operating potential and ground through the two FET's in series.

7 Claims, 3 Drawing Figures

1

HIGH FREQUENCY AMPLIFIER

REFERENCE TO RELATED APPLICATION

This application is related to application Ser. No. 604,778 filed concurrently herewith by Scott J. Butler, Robert J. Regan, and Anthony B. Varallo entitled "High Voltage, High Frequency Amplifier Circuit," and assigned to the assignee of the present application.

BACKGROUND OF THE INVENTION

This invention relates to high frequency amplifier circuits. More particularly, it is concerned with high voltage, high frequency amplifier circuits employing power transistors.

Transistor operating voltages are limited by inter-region breakdown voltages, in the case of bipolar transistors $BV_{CES}$ (collector-to-emitter breakdown voltage) and in the case of field effect transistors $BV_{DSS}$ (drain-to-source breakdown voltage). When a field effect transistor is used as the active component in a class C amplifier and the output impedance of the transistor is properly matched, the transistor drain voltage level normally swings from the drain-source saturation voltage to approximately twice the supply voltage. Similar voltages occur in class C amplifiers using bipolar transistors. Under certain conditions voltage standing waves with peak amplitudes greater than twice the power supply voltage are possible. Therefore, supply voltage levels somewhat lower than one-half the maximum breakdown voltage value are normally employed in amplifiers of this type.

Ideally, in order to achieve high output power transistors having high breakdown voltage capabilities would be employed with high supply voltages. High breakdown voltage and high frequency operation, however, are conflicting requirements in semiconductor device design. Because of the thin interaction regions within devices necessary in order to achieve high operating frequencies, high frequency devices have inherently low breakdown voltages.

Therefore, in order to increase amplifier output power at high frequency operation, parallel active devices or parallel power amplifiers are commonly utilized. The drive power is divided and applied to the individual amplifying devices, and the output powers are then combined to achieve the desired power level. This arrangement provides a new higher power amplifier which operates at the same dc supply voltage but draws more dc current depending on the number of parallel power units.

SUMMARY OF THE INVENTION

Improved high frequency amplifying circuitry in accordance with the present invention permits high frequency operation with relatively high supply voltages. The circuitry includes an input connection, an output connection, and first and second transistors each of which has a first, a second, and a third electrode. Input means couples the input connectin to the first electrode of the first transistor and to the first electrode of the second transistor. The input means includes a first dc blocking means between the first electrode of the first transistor and the first electrode of the second transistor to prevent dc current flow between them. Output means couples the second electrode of the first transistor and the second electrode of the second transistor to the output connection. The output means includes a second dc blocking means between the second electrode of the first transistor and the second electrode of the second transistor to prevent dc current flow between them. Thus, parallel first and second ac conductive paths are provided between the input connection and the output connection through the first transistor and the second transistor, respectively. The circuitry also includes means for connecting the second electrode of the first transistor to a source of operating potential and means for connecting the third electrode of the second transistor to a reference potential. The first electrode of the first transistor is coupled to the second electrode of the second transistor by ac blocking means. Thus, a dc conductive path is provided between the source of operating potential and the reference potential through the first transistor and the second transistor in series. The operating potential of the source is thus divided between the transistors by virtue of the dc series path such that each transistor shares the dc power equally, while separate parallel ac signal paths are provided through each transistor and combined at the output.

For a better understanding of the present invention, together with other and further objects, advantages and capabilities thereof, reference is made to the following disclosure and appended claims in connection with the above described drawings.

DETAILED DESCRIPTION OF THE INVENTION

Figure 1:
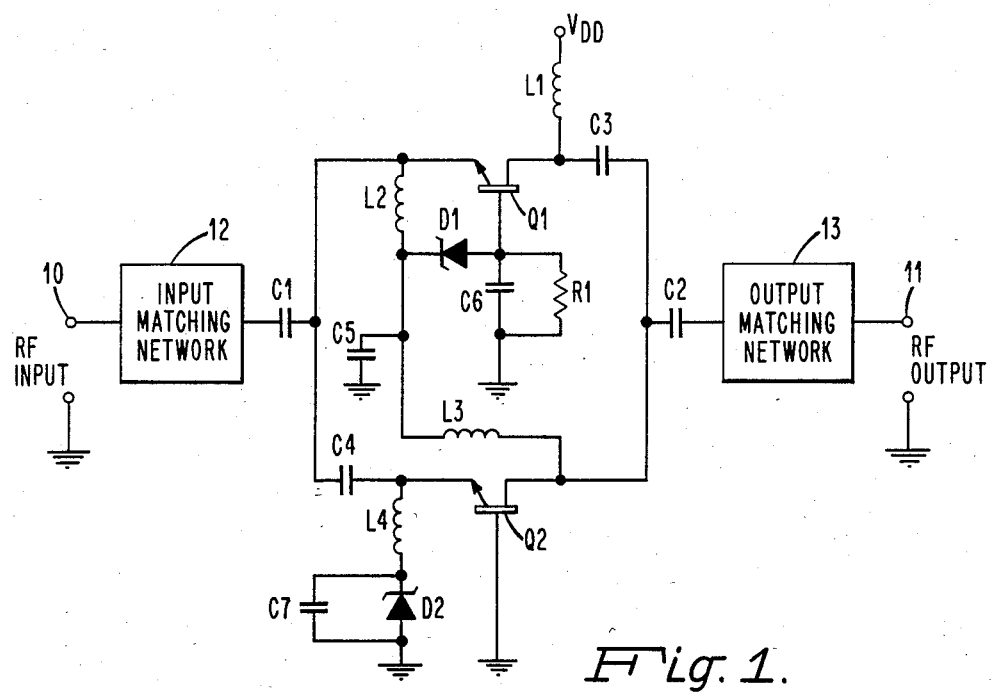
FIG. 1 is a schematic circuit diagram of a high frequency amplifier circuit in accordance with the present invention.

FIG. 1 illustrates a high frequency amplifier circuit in accordance with the present invention. The circuit employs two junction field effect transistors (JFETs) Q1 and Q2 having substantially the same characteristics, more specifically, the transistors may be high power static induction transistors (SITs). The circuit includes an RF input terminal 10 and an RF output terminal 11. An input matching network 12 matches the input impedance of the circuit to the output impedance of the circuitry or transmission line connected to the input terminal 10. Similarly, an output matching network 13 matches the output impedance of the circuit to the imput impedance of the succeeding circuitry or transmission line connected to the output terminal 11.

The input terminal 10 is coupled by way of the input matching network 12 and a coupling capacitance C1 to the source electrodes of the first and second transistors Q1 and Q2. A capacitance C4 is connected between the source electrodes of the transistors Q1 and Q2 to block the flow of dc current between them. The drain electrodes of the transistors Q1 and Q2 are coupled through an ac coupling capacitor C2 to the output matching network 13. A capacitance C3 is connected between the drain electrodes of the two transistors Q1 and Q2 to provide a block to dc current flow.

A source of dc operating potential $V_{DD}$ is connected through an RF choke, or inductance, L1 to the drain electrode of the first transistor Q1. The gate electrode of the first transistor Q1 is connected to ground by an ac bypass capacitance C6 in parallel with a dc current limiting resistance R1. The source electrode of the first transistor Q1 is connected to the drain electrode of the second transistor Q2 by way of inductances L2 and L3 connected in series. The juncture between the inductances L2 and L3 is connected to the gate electrode of the first transistor Q1 by a voltage reference diode, such as a zener diode, D1 which establishes the dc biasing potential between the source and gate electrodes of the first transistor Q1 such that a positive bias potential is established at the source. The juncture of the two inductances L2 and L3 is also coupled to ground through an ac bypass capacitance C5.

The gate electrode of the second transistor Q2 is connected directly to ground. The source electrode of the second transistor Q2 is connected through an inductance L4 and a zener diode D2 to ground such that a positive bias potential is established at the source. An ac bypass capacitance C7 is connected from the juncture of the inductance L4 and the diode D2 to ground. The zener diode D2 establishes the dc biasing potential between the source and gate electrodes of the second transistor Q2.

A single dc path is thus provided from the source of operating voltage $V_{DD}$ through both transistors Q1 and Q2 in series to ground. The RF chokes, or inductances, L1, L2, L3, and L4 block this path to ac current. The source-to-gate dc bias potential is made to be substantially the same for both transistors Q1 and Q2 by employing two zener diodes D1 and D2 having the same breakdown voltage. The drain-to-source and drain-to-gate dc biasing potentials of the two transistors are also substantially equal. Thus, the two transistors Q1 and Q2 are effectively biased at the same dc potential levels and are driven in phase by the input ac signal. The two transistors thus operate in parallel with respect to the ac signals. The dc supply voltage from the source $V_{DD}$ is divided between the two transistors Q1 and Q2 connected in series. Therefore, the supply voltage is not limited to a value of one-half the breakdown voltage of the individual transistors as would be the case in a conventional amplifier.

Although the amplifier circuit as illustrated in FIG. 1 employs JFETs, specifically of the SIT type, high frequency bipolar transistors together with suitable dc biasing arrangements may be employed. In addition, the circuitry may be utilized as a high frequency oscillator by suitably coupling the output to the input.

A specific embodiment of the amplifier circuit as illustrated in FIG. 1 was constructed employing the following components:

| | |
|---|---|
| Q1 and Q2 | GTE Laboratories Incorporated 7 μm pitch, 2 cm gate width SIT's |
| D1 and D2 | 8.2 v zener diode |
| R1 | 4.7 kΩ |
| L1, L2, L3, and L4 | .39 μH |
| C1, C2, C3, and C4 | 75 pf |
| C5 and C7 | 1000 pf |
| C6 | 75 pf, 75 pf, and 1000 pf in parallel |
| Input Matching Network | Double stub tuner |
| Output Matching Network | Double stub tuner |
| $V_{DD}$ | 170 v |

The frequency of the input signal was 900 MHz, and the circuit produced 22 watts of output power with a gain of 10 db.

Figure 2:
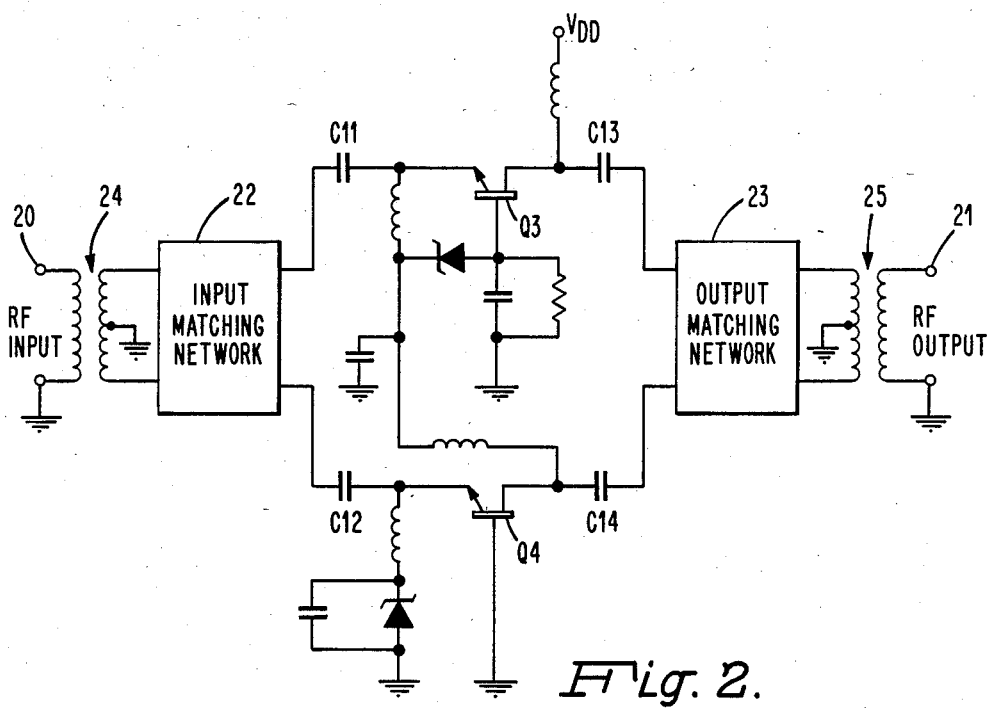
FIG. 2 is a schematic circuit diagram of a high frequency push-pull amplifier circuit in accordance with the present invention.

FIG. 2 illustrates a modification of the circuit of FIG. 1 in which two transistors Q3 and Q4 are driven 180° out of phase in a push-pull arrangement. In this circuit the ends of the primary winding of an input transformer 24 are connected to an input terminal 20 and ground. The ends of the secondary winding of the input transformer 24 are connected through an input matching network 22 to the source electrodes of the two transistors Q3 and Q4 by way of dc blocking capacitors C11 and C12. The center tap of the second winding of the transformer 24 is connected to ground. The drain electrodes of the transistor Q3 and Q4 are connected by way of dc blocking capacitances C13 and C14 and an output matching network 23 to the ends of the primary winding of an output transformer 25. The center tap of the primary winding of the output transformer 25 is connected to ground. The secondary winding of the output transformer 25 is connected between an RF output terminal 21 and ground. The push-pull arrangement, illustrated in FIG. 2, reduces potential phasing differences within the two parallel ac paths through the amplifier circuit and provides a high voltage, high frequency amplifier with manageable impedance levels and with broadband frequency capability.

Figure 3:
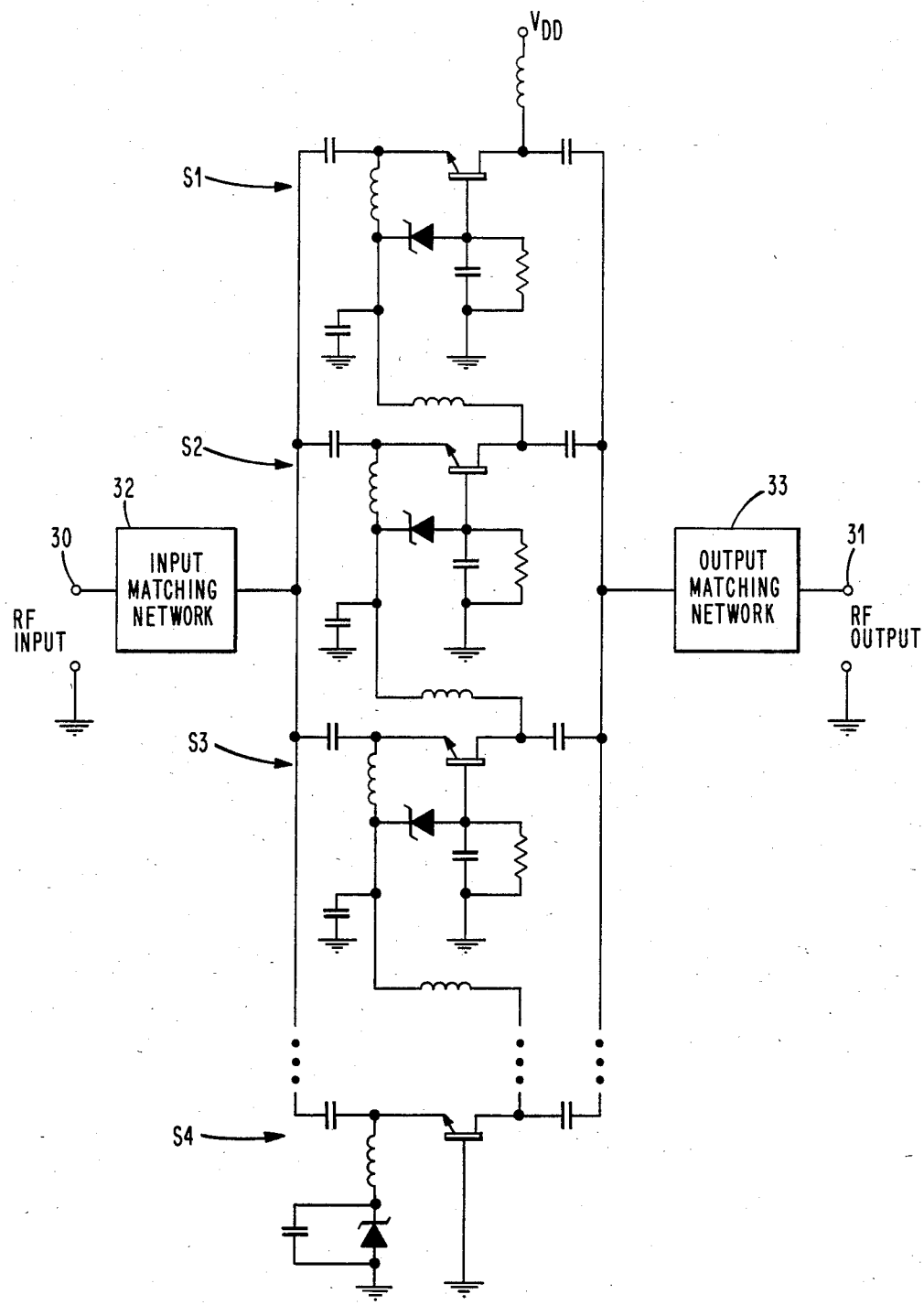
FIG. 3 is a circuit diagram of a modification of the high frequency amplifier circuit illustrated in FIG. 1.

FIG. 3 illustrates the manner in which an expanded amplifier circuit in accordance with the present invention can be constructed to provide N parallel ac amplifying paths with a single dc power supply path in series through N transistors. An RF input terminal 30 is connected through an appropriate input matching network 32 to several stages S1-SN. The outputs of the stages are connected together and through an output matching network 33 to an RF output terminal 31. Each of the stages S1 . . . except the last stage SN in the plurality is similar to the stage employing the first transistor Q1 in the circuit of FIG. 1. The last stage SN in the plurality of stages is similar to the stage employing the second transistor Q2 in the circuit of FIG. 1. Thus, the dc current path is from the source of operating voltage $V_{DD}$ through each of the transistors of the stages S1-SN in series to ground. The stage S1-SN provide N parallel ac amplifying paths with the operating voltage $V_{DD}$ divided between them, thus providing for a very high amplifier operating potential.

While there has been shown and described what are considered preferred embodiments of the present invention, it will be obvious to those skilled in the art that various changes and modifications may be made therein without departing from the invention as defined by the appended claims.

What is claimed is:
1. High frequency amplifying circuitry comprising
    an input connection;
    an output connection;
    first and second transistors each having source, drain, and gate electrodes;
    input means coupling said input connection to the source electrode of the first transistor and to the source electrode of the second transistor, said input means including a first dc blocking capacitance between the source electrode of the first transistor and the source electrode of the second transistor and preventing the flow of dc current between the source electrode of the first transistor and the source electrode of the second transistor;

output means coupling the drain electrode of the first transistor and the drain electrode of the second transistor to said output connection, said output means including a second dc blocking capacitance between the drain electrode of the first transistor and the drain electrode of the second transistor and preventing the flow of dc current between the drain electrode of the first transistor and the drain electrode of the second transistor;

whereby parallel first and second ac conductive paths are provided between the input connection and the output connection through the first transistor and the second transistor, respectively;

a single dc conductive path between a source of operating potential and a reference potential, said path being through the first transistor and the second transistor in series, said path blocking ac current flow therethrough, and said path comprising means including an ac blocking inductance for connecting the drain electrode of the first transistor to said source of operating potential;

means for connecting the gate electrode of the second transistor to said reference potential; and ac blocking inductance means coupling the source electrode of the first transistor to the drain electrode of the second transistor.

2. High frequency amplifying circuitry in accordance with claim 1 including first dc biasing means connected between the source and gate electrodes of the first transistor for establishing a dc bias potential between the source and gate electrodes of the first transistor; and second dc biasing means connected between the source and gate electrodes of the second transistor for establishing a dc bias potential between the source and gate electrodes of the second transistor, the dc bias potential between the source and gate electrodes of the first transistor being equal to the dc bias potential between the source and gate electrodes of the second transistor.

3. High frequency amplifying circuitry in accordance with claim 2 wherein said transistors are field effect transistors.

4. High frequency amplifying circuitry in accordance with claim 2 wherein said transistors are static induction transistors.

5. High frequency amplifying circuitry in accordance with claim 2 wherein said first dc biasing means includes a voltage reference diode connected between the source and gate electrodes of the first transistor; and said second dc biasing means includes a voltage reference diode connected between the source and gate electrodes of the second transistor.

6. High frequency amplifying circuitry comprising an input connection;

an output connection;

a plurality of three or more transistors each having source, drain, and gate electrodes;

input means coupling said input connection to the source electrodes of said plurality of transistors, said input means including first dc blocking capacitances between the source electrode of each transistor and the source electrodes of all of the other transistors of the plurality and preventing the flow of dc current between the source electrode of each transistor and the source electrodes of the other transistors of the plurality;

output means coupling the drain electrode of the plurality of transistors to said output connection, said output means including dc blocking capacitances between the drain electrode of each transistor and the drain electrodes of all of the other transistors of the plurality and preventing the flow of dc current between the drain electrode of each transistor and the drain electrodes of the other transistors of the plurality;

whereby a plurality of parallel ac conductive paths are provided between the input connection and the output connection through the plurality of transistors;

a single dc conductive path between a source of operating potential and a reference potential, said path being through the plurality of transistors in series, said path blocking ac current flow therethrough, and said path comprising means including an ac blocking inductance for connecting the drain electrode of the first transistor of the plurality to said source of operating potential;

means for connecting the gate electrode of the last transistor of the plurality to said reference potential; and ac blocking inductance means coupling the source electrode of each transistor of the plurality except the last to the drain electrode of the next transistor of the plurality.

7. High frequency amplifying circuitry in accordance with claim 6 including a plurality of dc biasing means each being connected between the source and gate electrodes of a transistor for establishing equal dc bias potentials between the source and gate electrodes of each of the plurality of transistors.

* * * * *